United States Patent [19]

Tachi

[11] 4,070,654

[45] Jan. 24, 1978

[54] BIPOLAR READ-ONLY MEMORY

[75] Inventor: Seiichi Tachi, Tokyo, Japan

[73] Assignee: Hitachi, Ltd., Japan

[21] Appl. No.: 722,578

[22] Filed: Sept. 13, 1976

[30] Foreign Application Priority Data

Sept. 26, 1975 Japan .................................. 50-115631

[51] Int. Cl.$^2$ ...................... G11C 11/34; G11C 13/00; H03K 3/286
[52] U.S. Cl. .................................. 365/104; 307/238; 307/281; 307/317 A; 365/175
[58] Field of Search .................... 340/173 R; 307/238, 307/281, 317 R, 317 A

[56] References Cited

U.S. PATENT DOCUMENTS

| | | | |
|---|---|---|---|
| 3,810,128 | 5/1974 | Moser | 340/173 R |
| 3,849,675 | 11/1974 | Waaben | 307/317 A |

*Primary Examiner*—Terrell W. Fears
*Attorney, Agent, or Firm*—Craig & Antonelli

[57] ABSTRACT

A bipolar read-only memory comprising a matrix circuit having selection input lines, digit output lines and Schottky barrier diodes connected between the selection input lines and the digit input lines according to information contained in the memory, a selection input circuit of an I$^2$L construction electrically associated with the selection input lines and a digit output circuit of an I$^2$L construction electrically associated with the digit output lines.

4 Claims, 4 Drawing Figures

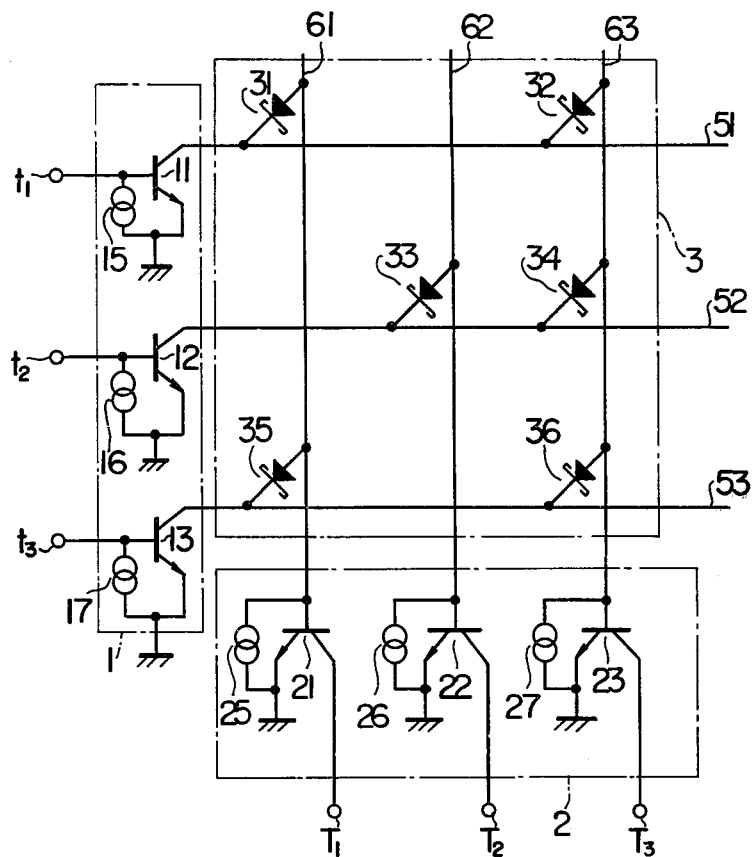
F I G. 1

BIPOLAR READ-ONLY MEMORY

This invention relates to semiconductor memories, and more particularly to a bipolar read-only memory.

Prior art read-only memories (abbreviated hereinafter as ROMs) using bipolar transistors comprised bipolar TTL gates disposed to form a matrix circuit, TTL inverters disposed in an output circuit, and transistors of multi-emitter structure or PN junction diodes of diffused junction type used as memory cells. It was therefore necessary to electrically isolate the individual transistors in the ROM from one another so that the ROM could be integrated into a semiconductor integrated circuit form. Due to the necessity for the electrical isolation of the transistors from one another, it was unable to integrate a ROM of large capacity into a semiconductor integrated circuit form.

A new logic circuit technique called IIL (Integrated Injection Logic) has been developed recently in an effort to dispense with the regions required heretofore for the electrical isolation. The basic principle of the IIL was disclosed by C. M. Hart et al in ISSCC Digest of Techinical Papers, pp. 92 – 93, February 1972 as well as H. H. Berger et al in ISSCC Digest of Technical Papers, pp. 90 – 91, February 1972. Application of this IIL principle to a ROM, however, necessitates memory cells of IIL structure in addition to transistors and other elements of IIL structure, and did not bring about marked improvements over the prior art ROM in that the area occupied by the so constructed ROM did not appreciably differ from the occupied by the prior art ROM using multi-emitter transistors and the integration density of the ROM was not so increased. The integration density may be improved when diffused PN junction diodes are used as the memory cells of the ROM. However, due to the fact that the transistor of IIL structure has a relatively low threshold voltage $V_{TH}$ of about 0.6 volts, while the PN junction diode has a relatively high threshold voltage, namely, a forward on-stage voltage $V_F$ of about 0.7 to 0.8 volts, such ROM has been defective in that the difference in $V_{TH}$ necessitates later level conversion resulting in complicated peripheral circuits.

It is an object of the present invention to provide a novel and improved ROM in which such prior art defects are obviated and which can be easily integrated into any desired semiconductor integrated circuit form of high integration density.

Another object of the present invention is to provide a ROM construction in which the merit of the proposed I²L structure is fully utilized and which can be easily integrated into the desired integrated circuit form of high integration density without modifying the IIL circuit arrangement.

In accordance with one aspect of the present invention, the ROM comprises a matrix circuit which includes Schottky barrier diodes formed at the areas of contact between semiconductor regions of low impurity concentration in a semiconductor substrate and overlying metal strip layers.

Other objects and advantages of the present invention will become apparent from the following description of a preferred embodiment thereof taken in conjunction with the accompanying drawings, in which:

FIG. 1 is a circuit diagram of a preferred embodiment of the ROM according to the present invention;

Figure 2:
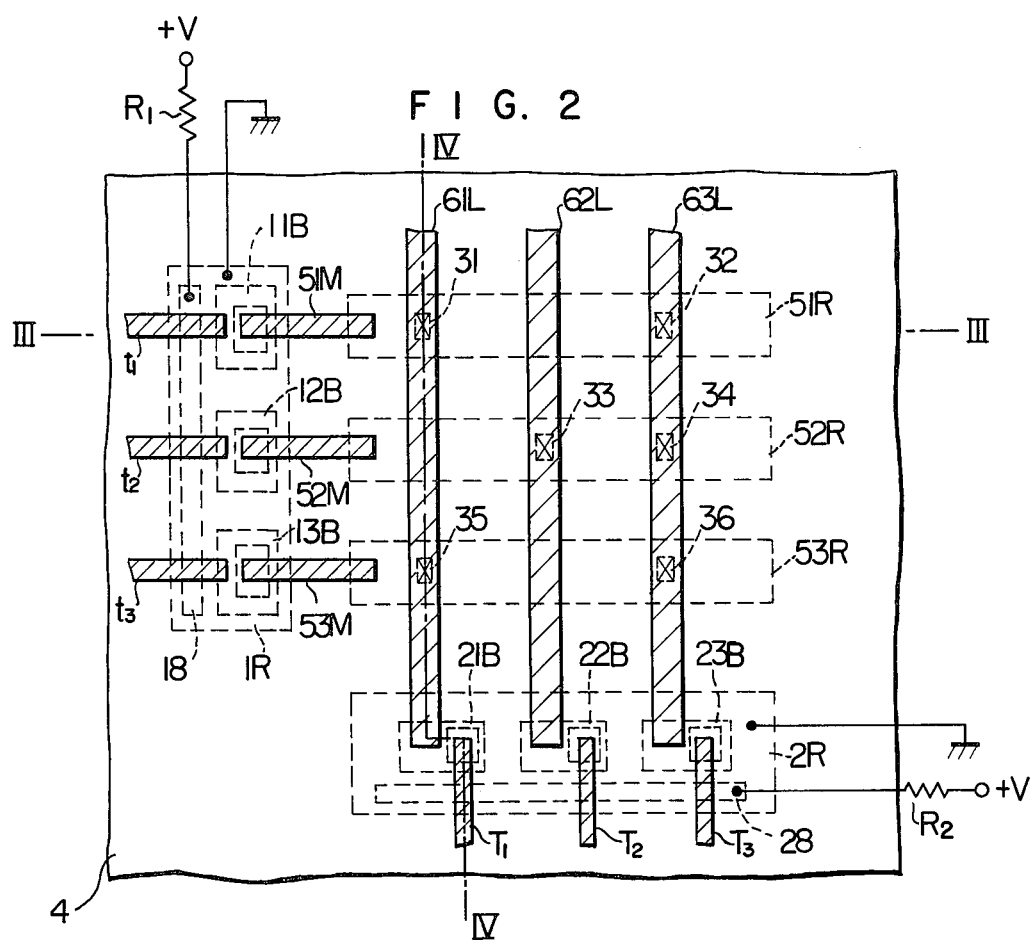
FIG. 2 is a schematic plan view showing the IC structure of the circuit shown in FIG. 1.

Referring now to FIG. 1, a preferred embodiment of the ROM according to the present invention comprises a selection input circuit 1, a digit output circuit 2, and a matrix circuit 3 including a plurality of memory cells. The selection input circuit 1 includes a first group of biploar transistors or selection input bipolar transistors 11, 12 and 13, and a first group of injection current sources 15, 16 and 17 connected across the base and the emitter of the respective transistors 11, 12 and 13. These selection input transistors 11, 12 and 13 are connected at their emitters in common to a source of reference potential, for example, ground potential, and at their collectors respectively to selection input lines 51, 52 and 53 of the matrix circuit 3. Further, these transistors 11, 12 and 13 are connected at their bases respectively to input terminals $t_1$, $t_2$ and $t_3$ of the ROM. The digit output circuit 2 includes a second group of bipolar transistors or digit output bipolar transistors 21, 22 and 23, and a second group of injection current sources 25, 26 and 27 connected across the base and the emitter of the respective transistors 21, 22 and 23. These digit output transistors 21, 22 and 23 are connected at their emitters in common to the reference potential source above described, and at their bases respectively to digit output lines 61, 62 and 63 of the matrix circuit 3. The digit output transistors 21, 22 and 23 are connected at their collectors respectively to output terminals $T_1$, $T_2$ and $T_3$ of the ROM. In the matrix circuit 3, a plurality of Schottky barrier diodes 31, 32, 33, 34, 35 and 36 are suitably connected between the digit output lines 61 to 63 and the selection input lines 51 to 53 depending on the information to be contained in the ROM, to provide the individual memory cells. It will thus be seen that the injection current sources 15, 16, 17, 25, 26 and 27 are connected respectively across the base and the emitter of the selection input transistors 11, 12, 13 and digit output transistors 21, 22, 23, and all of these combinations are of IIL structure.

The operation of the ROM of the present invention having such circuit arrangement will now be described with reference to FIG. 1. Suppose, for example, that a voltage of high level is applied to the base of the selection input transistor 13 from the input terminal $t_3$. The transistor 13 is turned on by the current injection from the injection current source 17, and a potential of low level appears on the selection input line 53. The collector-to-emitter saturation voltage $V_{CE(SAT)}$ of the transistor 13 is about 0.05 volts, and the threshold voltage or the forward voltage $V_F$ of the Schottky barrier diode 35 is about 0.3 volts. In the result, the low or zero level voltage $V_{OL}$ appearing on the digit output line 61 is given by $$V_{OL} = V_{CE(SAT)} + V_F \approx 0.35 \text{ volts}$$

Since each of the digit output transistors 21, 22 and 23 in the digit output circuit 2 has a threshold voltage $V_{TH} = V_{BE} \approx 0.6$ volts, current flows by way of a current path which is traced from the injection current sources 25 and 27 to earth through the Schottky barrier diodes 35, 36 and the selection input transistor 13. The digit output transistors 21 and 23 are turned off, and an output of high level appears at their collectors. On the other hand, the digit output transistor 22 remains turned on by the current injection from the injection current source 26, and an output of low level appears at its collector. It will thus be seen that the provision of the digit output circuit 2 of IIL structure eliminates the prior art necessity for connecting especial potential sources to the digit output lines 61, 62 and 63, thereby simplifying the circuit structure of the ROM and decreasing the area occupied by the ROM.

Figure 3:
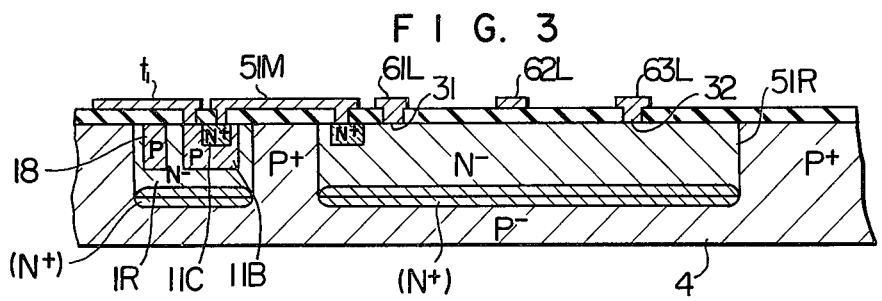
FIG. 3 is a schematic sectional view taken along the line III — III in FIG. 2.
Figure 4:
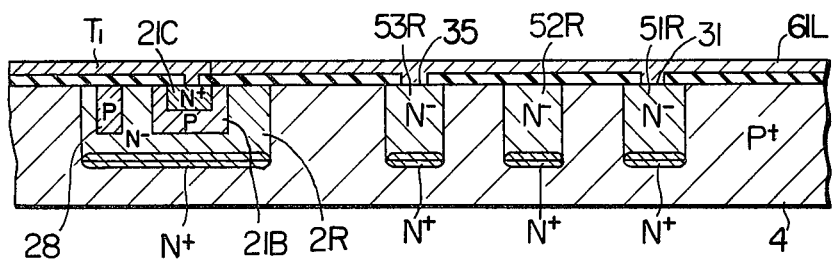
FIG. 4 is a schematic sectional view taken along the line IV — IV in FIG. 2.

FIG. 2 is a schematic plan view of the ROM of semiconductor integrated circuit form shown in FIG. 1, and FIGS. 3 and 4 are schematic sectional views taken along the lines III — III and IV — IV in FIG. 2 respectively.

Referring to FIG. 2, a semiconductor substrate 4 of, for example, P-type silicon a plurality of regions or islands 1R, 2R, 51R, 52R and 53R which are electrically isolated from one another and have a conductivity type opposite to that of the semiconductor substrate 4. Thus, these islands 1R, 2R, 51R, 52R and 53R are regions of, for example, N-type. The selection input transistors 11, 12 and 13 in the selection input circuit 1 are formed in the island 1R which is a first common semiconductor region. These selection input transistors 11, 12 and 13 need not be completely electrically isolated from one another since they are common-connected at their emitters. The digit output transistors 21, 22 and 23 in the digit output circuit 2 are similarly formed in the island 2R which is a second common semiconductor region. Similarly, these digit output transistors 21, 22 and 23 need not be completely electrically isolated from one another since they are also common-connected at their emitters. The islands 51R, 52R and 53R provide the respective selection input lines 51, 52 and 53 and are respectively electrically connected to the collectors of the selection input transistors 11, 12 and 13 by a plurality of conductor layers 51M, 52M and 53M deposited on the surface of the substrate 4. The island 51R, 52R and 53R provide, at the same time, part of the Schottky barrier diodes 31 to 36. These islands 51R, 52R and 53R, which are elongated semiconductor regions, are covered with an insulating film, and a plurality of metal strip layers 61L, 62L and 63L of, for example, aluminum are deposited on the insulating film to extend across the islands 51R, 52R and 53R to provide the digit output lines 61, 62 and 63. These metal strip layers 61L, 62L and 63L are respectively electrically connected to the bases of the digit output transistors 21, 22 and 23. The metal strip layers 61L, 62L and 63L are arranged to make electrical contact with predetermined portions of the islands 51R, 52R and 53R in a manner as described later to form the Schottky barrier diodes 31 to 36 at the contact portions or areas of interface. Each of the Schottky barrier diodes has a forward voltage $V_F$ (e.g., 0.3 V) smaller than the threshold voltage (base-to-emitter voltage) $V_{BE}$ of the output transistors (e.g., 0.6 V).

Referring now to FIGS. 3 and 4 being a schematic sectional views taken along the lines III — III and IV — IV in FIG. 2, a P-type diffused region 18, which is an elongated third common semiconductor region, and another P-type diffused region 11B are formed in the island 1R which is the first common semiconductor region of N-type formed in the semiconductor substrate 4 of P-type silicon. Further, an N-type diffused region 11C is formed in the P-type diffused region 11B. The selection input transistor 11 is of vertical NPN structure in which the emitter, base and collector are provided respectively by a portion of the N-type region 1R, the P-type diffused region 11B, and the N-type diffused region 11C. That is, the vertical NPN transistor is of the inverse mode in which a collector is surrounded by a base region, as opposed to a standard bipolar transistor structure. The remaining selection input transistors 12 and 13 also are respectively of vertical NPN structure similar to the selection input transistor 11. The common emitter 1R of these vertical NPN transistors is tied to a reference potential, namely ground potential. On the other hand, the injection current source 15 is a PNP transistor of lateral structure in which the emiter, base and collector are provided respectively by a portion of the P-type diffused region 18, the portion of the N-type region 1R acting as the emitter of the transistor 11, and the P-type diffused region 11B acting as the base of the transistor 11. Therefore, the same portion of the N-type region 1R provides the emitter and the base respectively of the NPN transistor of vertical structure and the PNP transistor of lateral structure, and the P-type region 11B provides the base and the collector respectively of the former and latter transistors. The structure of the remaining injection current sources 16 and 17 is similar to that of the injection current source 15. The common P-type emitter region 18 is electrically connected to a positive potential source +V through a resistor $R_1$ so as to be forward-biased with respect to the N-type region 1R. The base regions 11B to 13B of the transistors 11 to 13 are connected to the input terminals $t_1$ to $t_3$ respectively. Thus, any isolation region for electrically isolating the selection input transistor 11 and the injection current source 15 from each other is utterly unnecessary. The island 1R can be utilized as a common emitter region due to the fact that the selection input transistors 11, 12 and 13 are common-connected at their emitters as described hereinbefore. Further, the PNP transistors of lateral structure providing the individual injection current sources 15, 16 and 17 common-connected at one end thereof have also a common emitter region. Thus, any regions for the electrical isolation of the transistors from one another are utterly unnecessary. Therefore, all the necessary elements of the selection input circuit 1 shown in FIG. 1 can be formed in the single island 1R. Similarly, all the necessary elements of the digit output circuit 2 can also be formed in the single island 2R in a manner entirely similar to that of formation of the elements of the selection input circuit 1. Needless to say, the metal strip layers 61L to 63L providing the digit output lines 61 to 63 are respectively connected to the base regions 21B to 23B of the digit output transistors 21 to 23 and the collector regions 21C to 23C of the transistors 21 to 23 are connected to the output terminals $T_1$ to $T_3$, respectively.

Referring to FIGS. 3 and 4 again, the island 51R is an N-type region of low impurity concentration and is electrically connected to the collector region 11C of the selection input transistor 11 by the conductor layer 51M of, for example, aluminum. As described hereinbefore, an insulating film covers the surface of the islands 51R, 52R and 53R providing the selection input lines 51 to 53, and the metal strip layers 61L, 62L and 63L providing the respective digit output lines 61, 62 and 63 are deposited on the surface of the insulating film to extend across the islands 51R, 52R and 53R. More precisely, in order to form the Schottky barrier diodes 31, 32 and 35 between the islands 51R and 53R of N-type semiconductor and the overlying metal strip layers 61L and 63L depending on the information to be contained in the ROM, contact openings are bored in predetermined portions of the insulating film in the areas of intersection between these metal strip layers 61L, 63L and the islands 51R, 52R and 53R thereby providing the desired Schottky barrier diodes 31, 32 and 35 by the metal-to-semiconductor contact. The metal strip layers may be formed by depositing a suitable metal, for example, aluminum by evaporation on the insulating film and on the exposed surface portions of the islands of N-type semiconductor. No opening is bored in the insulating film in the area of intersection between the island 51R and the metal strip layer 62L nor in the area between the island 52R and the metal strip layer 61L since any Schottky barrier diode is not provided to connect the selection input line 51 to the digit output line 62 and the selection input line 52 to the digit output line 61. The manner of formation of the remaining Schottky barrier diodes 33, 34 and 36 between the islands 52R, 53R and the metal strip layers 62L, 63L is similar to that described with reference to the formation of the Schottky barrier diodes 31, 32 and 35 between the islands 51R and 53R and the metal strip layers 61L and 63L. It will thus be seen that the Schottky barrier diodes of small size providing the memory cells of the ROM can be simply formed by boring contact openings in predetermined portions of the insulating film in the areas of intersection between the islands 51R to 53R providing the selection input lines 51 to 53 and the metal strip layers 61L to 63L providing the digit output lines 61 to 63 to establish local contacts between the metal strip layers 61L to 63L and the semiconductor islands 51R to 53R.

It will be understood from the foregoing detailed description of a preferred embodiment of the present invention that the present invention provides a ROM of semiconductor integrated circuit structure in which a plurality of transistors and injection current sources constituting a selection input circuit are incorporated in one island formed in a semiconductor substrate, while a plurality of transistors and injection current sources constituting a digit output circuit are incorporated in another island formed in the substrate, and a group of other islands formed in the substrate for providing selection input lines or digit output lines and a group of metal strip layers formed on the substrate for providing the digit output lines or selection input lines are locally brought into contact at predetermined portions to provide Schottky barrier diodes connected between the selection input lines and the digit output lines to represent the information to be contained in the ROM.

The present invention is therefore advantageous in that the area occupied by the ROM can be reduced due to the face that the individual transistors need not be electrically isolated from one another, and the selection input circuit and the digit output circuit can be incorporated in the individual single islands. The present invention is further advantageous in that the integration density of the semiconductor integrated circuit device can be greatly improved due to the fact that any especial circuit arrangement is not required to provide the digit output lines, and the area occupied by the ROM can further be reduced.

I claim:

1. A bipolar read-only memory containing information, comprising:
    input and output terminals;
    a matrix circuit having selection input lines, digit output lines and a plurality of Schottky barrier diodes connected between predetermined ones of said selection input lines and predetermined ones of said digit output lines in accordance with the contained information, said input and output lines being arranged in rows and columns;
    a selection input circuit having a first group of bipolar transistors and a first group of injection current sources one for each said first group transistor, each said first group transistor interconnecting different one of said input terminals and different one of said selection input lines; and
    a digit output circuit having a second group of bipolar transistors and a second group of injection current sources one for each said second group transistor, each said second group transistor interconnecting different one of said output terminals and different one of said digit output lines.

2. A bipolar read-only memory according to claim 1, in which each of said first group of transistors is an NPN transistor having its base and collector connected with its associated input terminal and selection input line respectively, the emitters of said first group of NPN transistors being connected in common to a reference potential source, each of said second group of transistors is an NPN transistor having its collector and base connected with its associated output terminal and digit output line respectively, the emitters of said second group of NPN transistors being connected in common to said reference potential source, and each of said first and second groups of injection current sources is constituted by a PNP transistor havng its collector and base connected with the base and emitter of its associated NPN transistor respectively, and its emitter connected to a positive potential source with respect to said reference potential source.

3. A bipolar read-only memory according to claim 2, in which:
    each of said first group of NPN transistors mainly consists of an emitter portion of a first common semiconductor region formed in a semiconductor substrate, a semiconductor base region formed in said emitter portion of said first common semiconductor region and having a conductivity type opposite to that of said first common region, and a semiconductor collector region formed in said base region and having a conductivity type opposite to that of said base region;
    each of said second group of NPN transistors mainly consists of an emitter portion of a second common semiconductor region formed in said semiconductor substrate, a semiconductor base region formed in said emitter portion of said second common semiconductor region and having a conductivity type opposite to that of said second common region, and a semiconductor collector region formed in said base region and having a conductivity type opposite to that of said base region;
    each of the PNP transistors serving as said first group of injection current sources for said first group of NPN transistors mainly consists of an emitter portion of an elongated third common semiconductor region formed in said first common semiconductor region, said emitter portion of said first common semiconductor region of its associated NPN transistor which portion also serves as the base of the PNP transistor, and said base region of said associated transistor also serving as the collector of the PNP transistor; and each of the PNP transistors serving as said second group of injection current sources for said second group of NPN transistors mainly consists of an emitter portion of an elongated fourth common semiconductor region formed in said second common semiconductor region, said emitter portion of said second common semiconductor region of its associated NPN transistor which portion also serves as the base of the PNP transistor, and said base region of said associated NPN transistor also serving as the collector of the PNP transistor.

4. A bipolar read-only memory according to claim 1, in which each of said selection input lines mainly consists of an elongated semiconductor region formed in a semiconductor substrate and each of said digit output lines mainly consists of a metal strip electrically connected with a portion of at least one of said elongated semiconductor regions to form a Schottky barrier diode at said connected portion.

* * * * *